(12) United States Patent
Sinha et al.

(10) Patent No.: US 10,541,211 B2
(45) Date of Patent: Jan. 21, 2020

(54) CONTROL WARPAGE IN A SEMICONDUCTOR CHIP PACKAGE

(71) Applicant: International Business Machines Corporation, Armonk, NY (US)

(72) Inventors: Tuhin Sinha, Hackensack, NJ (US); Krishna R. Tunga, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/486,749

(22) Filed: Apr. 13, 2017

(65) Prior Publication Data
US 2018/0301355 A1    Oct. 18, 2018

(51) Int. Cl.
*H01L 23/00* (2006.01)

(52) U.S. Cl.
CPC .................. *H01L 23/562* (2013.01)

(58) Field of Classification Search
CPC ....... H01L 2924/00; H01L 2224/32225; H01L 2224/73204; H01L 2224/16225; H01L 2924/00014
See application file for complete search history.

(56) References Cited

U.S. PATENT DOCUMENTS

| 6,429,384 | B1 | 8/2002 | Downes, Jr. et al. |
| 7,459,782 | B1* | 12/2008 | Li .......................... H01L 23/36 257/678 |
| 7,670,962 | B2 | 3/2010 | Huemoeller et al. |
| 8,455,991 | B2 | 6/2013 | Hsiao et al. |
| 8,598,698 | B1 | 12/2013 | Lim |
| 2005/0266607 | A1 | 12/2005 | Lee et al. |
| 2007/0063324 | A1 | 3/2007 | Mishiro et al. |
| 2008/0003780 | A1 | 1/2008 | Sun et al. |
| 2009/0085228 | A1 | 4/2009 | Sun et al. |
| 2010/0109169 | A1* | 5/2010 | Kolan .................. H01L 21/486 257/787 |
| 2010/0233867 | A1* | 9/2010 | Akiyama ............ H01L 21/3043 438/464 |
| 2011/0233790 | A1 | 9/2011 | Bchir |
| 2013/0003319 | A1 | 1/2013 | Malatkar et al. |
| 2013/0119540 | A1 | 5/2013 | Hong et al. |
| 2014/0239569 | A1 | 8/2014 | Merte et al. |
| 2014/0264954 | A1* | 9/2014 | Wong ..................... H01L 25/50 257/787 |

FOREIGN PATENT DOCUMENTS

TW            200725858 A        7/2007

* cited by examiner

*Primary Examiner* — Tony Tran
(74) *Attorney, Agent, or Firm* — Law Offices of Ira D. Blecker, P.C.

(57) ABSTRACT

A method to control warpage in a semiconductor chip package that includes: attaching a semiconductor chip to a semiconductor chip package; attaching a stiffener to the semiconductor chip package so that the semiconductor chip is contained within the stiffener, the stiffener having a coefficient of thermal expansion (CTE) less than that of the substrate on which the chip is assembled; attaching the semiconductor chip package to a laminate substrate; and removing the stiffener.

20 Claims, 6 Drawing Sheets

CONTROL WARPAGE IN A SEMICONDUCTOR CHIP PACKAGE

BACKGROUND

The present exemplary embodiments pertain to controlling warpage during bond and assembly of semiconductor chip packages, particularly chip scale packages.

Semiconductor chips may be attached (or joined) to a semiconductor chip package for signal distribution, power distribution and other functions. The attaching of the semiconductor chip to the semiconductor chip package is done in a bond and assembly process.

The attached semiconductor chip and semiconductor chip package may then be joined to a larger substrate in a further bond and assembly process.

Warpage control during the bond and assembly processes is a major issue with semiconductor chip packages.

BRIEF SUMMARY

The various advantages and purposes of the exemplary embodiments as described above and hereafter are achieved by providing, according to an aspect of the exemplary embodiments, a method to control warpage in a semiconductor chip package comprising: attaching a semiconductor chip to a semiconductor chip package; underfilling the semiconductor chip with an underfill material; attaching a stiffener to the semiconductor chip package so that the semiconductor chip is contained within the stiffener, the stiffener having a coefficient of thermal expansion (CTE) less than that of the semiconductor chip package; attaching the semiconductor chip package to a laminate substrate; underfilling the semiconductor chip package with an underfill material; and removing the stiffener.

According to another aspect of the exemplary embodiments, there is provided a method to control warpage in a semiconductor chip package comprising: attaching a semiconductor chip to a semiconductor chip package; attaching a stiffener to the semiconductor chip package so that the semiconductor chip is contained within the stiffener, the stiffener having a coefficient of thermal expansion (CTE) less than that of the semiconductor chip package; attaching the semiconductor chip package to a laminate substrate; and removing the stiffener.

According to a further aspect of the exemplary embodiments, there is provided a method to control warpage in a semiconductor chip package comprising: attaching by a solder ball connection a semiconductor chip to a semiconductor chip package; underfilling the semiconductor chip with an underfill material; adhesively attaching an optically transparent stiffener to the semiconductor chip package so that the semiconductor chip is contained within the stiffener, wherein the stiffener is in the form of a frame that surrounds the semiconductor chip, the stiffener having a coefficient of thermal expansion (CTE) less than that of the semiconductor chip package; attaching by a solder ball connection the semiconductor chip package to a laminate substrate; underfilling the semiconductor chip package with an underfill material; and removing the stiffener by a laser ablation process.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 3 to 8 illustrate an exemplary embodiment of a method to control warpage in a semiconductor chip package in which:

FIGS. 9A and 9B illustrate an exemplary embodiment of a stiffener where

FIGS. 10A and 10B illustrate another exemplary embodiment of a stiffener where

DETAILED DESCRIPTION

Figure 1:
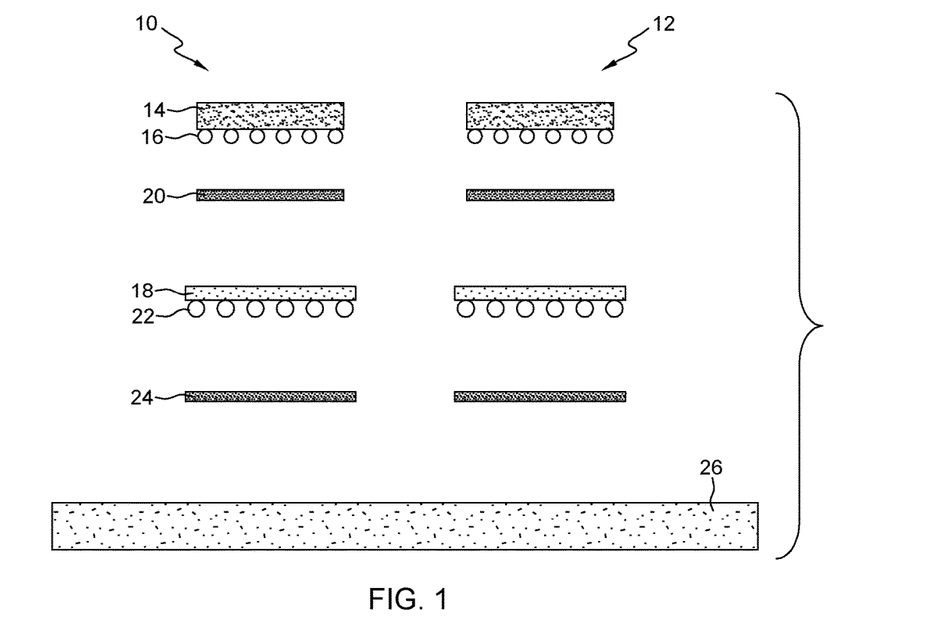
FIG. 1 is an exploded view of two chip package assemblies.

Referring to the Figures in more detail, and particularly referring to FIG. 1, there is an exploded view of two chip package assemblies 10, 12. Each of the chip package assemblies 10, 12 includes a semiconductor chip 14 which may have solder balls 16 known as controlled collapse chip connections (C4s). The solder balls 16 of semiconductor chip 14 may be attached to pads (not shown) on semiconductor chip package 18. Thereafter, an underfill material 20, such as an epoxy, may be dispensed and cured between the semiconductor chip 14 and semiconductor chip package 18.

Semiconductor chip package 18 may be a laminate substrate. In a preferred embodiment, semiconductor chip package 18 is a thin, chip scale package. A chip scale package (CSP) typically may have an area no greater than 1.2 times that of the semiconductor chip 14. However, the CSP in the exemplary embodiments may have an area greater than 20% more than that of the area of the semiconductor chip 14.

The semiconductor chip package 18 may also have solder balls 22 in a ball grid array for attaching to pads (not shown) on laminate substrate 26. When the semiconductor chip package 18 is a CSP, the pitch of the solder balls 22 should be less than 1 millimeter (mm) and preferably is less than 500 micrometers (μm). Thereafter, an underfill material 24, such as an epoxy, may be dispensed and cured between the semiconductor chip package 18 and the laminate substrate 26.

Laminate substrate 26 is much larger than semiconductor chip package 18 as the laminate substrate 26 may have several chip package assemblies including chip package assemblies 10, 12 as well as other chip package assemblies not shown.

Figure 2:
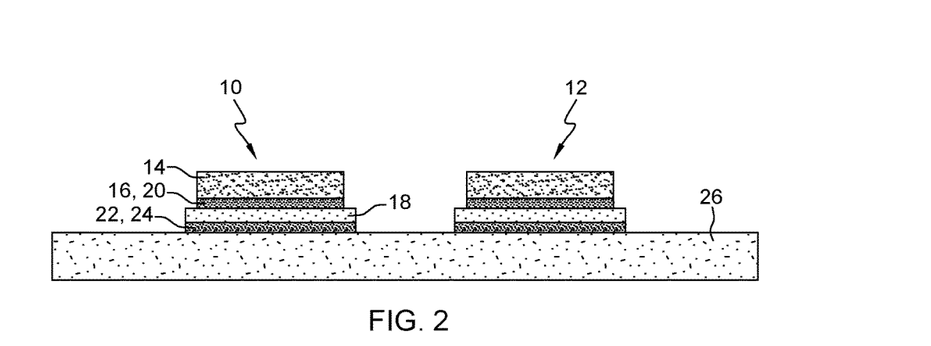
FIG. 2 illustrates the assembled chip package assemblies of FIG. 1 on a laminate substrate.

FIG. 2 illustrates the assembled chip package assemblies 10, 12 on laminate substrate 26.

Warpage problems such as excessive die curvature leading to detrimental die stresses can occur during bond and assembly. Warpage with a CSP is exacerbated during bond and assembly due to the high die area to laminate area ratio.

Proposed in the exemplary embodiments is a stiffening mechanism attached to the semiconductor chip package 18. The stiffening mechanism is only needed until the point where the semiconductor chip package 18 is attached to the laminate substrate 26. After attaching to the laminate substrate 26, the laminate substrate 26 provides sufficient stiffness to prevent excessive curvature and hence stresses in the die.

The exemplary embodiments propose to incorporate a temporary stiffener in the bond and assembly process. The temporary stiffener may be attached to the semiconductor chip package 18 before or after the die attach and underfill cure. The temporary stiffener will provide enough stiffness throughout the bond and assembly process. Once the semiconductor chip package 18 has been attached to the laminate substrate 26, the temporary stiffener may be removed.

If the laminate substrate 26 has multiple chip package assemblies 10, 12 such as that shown in FIGS. 1 and 2, the temporary stiffener may be attached during simultaneous bonding of the chip package assemblies 10, 12 to the laminate substrate 26 or the temporary stiffener may be attached serially as each of the chip package assemblies 10, 12 is bonded to the laminate substrate 26.

Referring now to FIGS. 3 to 8, there is illustrated an exemplary embodiment of a method to control warpage in a semiconductor chip package. The curvatures of the semiconductor chip 14, semiconductor chip package 18 and laminate substrate 26 have been exaggerated for the purposes of illustration.

Figure 3:
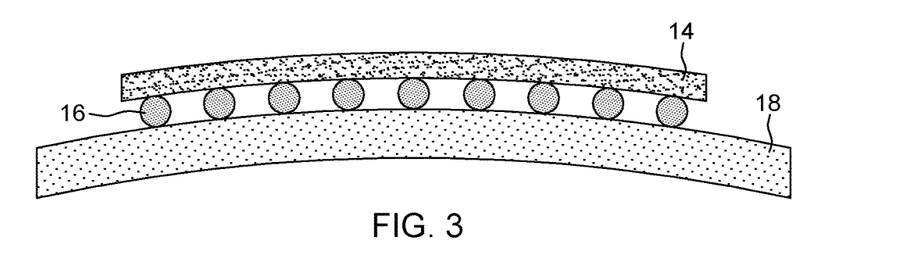
FIG. 3, illustrates a semiconductor chip attached on a semiconductor chip package.

Referring to FIG. 3, semiconductor chip 14 has been conventionally attached to the semiconductor chip package 18 by solder balls 16.

Figure 4:
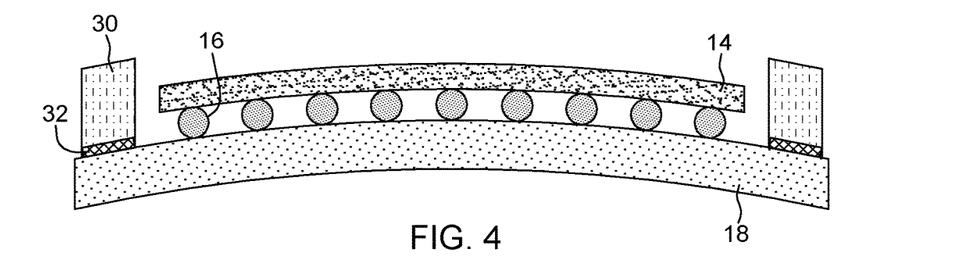
FIG. 4 illustrates a stiffener attached to the semiconductor chip package.

In FIG. 4, a stiffener 30 has been attached to the semiconductor chip package 18. The stiffener may be any material that has a coefficient of thermal expansion (CTE) less than that of the semiconductor chip package 18. The CTE of the substrate is generally between 9 ppm (parts per million)/° C. to 18 ppm/° C. For purposes of illustration and not limitation, it is preferred that the CTE of the stiffener 30 be in the range of 2 to 12 ppm/° C.

In one exemplary embodiment, the stiffener 30 is optically transparent. Optically transparent means transparent to visible, infrared (IR) or ultraviolet (UV) light. Optically transparent materials may include glass, sapphire, quartz, diamond, poly(methyl methacrylate) (PMMA), hardened resin (hardened epoxy or an acrylic material that is transparent and linear low-density polyethylene (LLDPE) plastic material. Glass is particularly preferred because it is relatively inexpensive and the CTE of the stiffener may be modulated to be in the desirable range of CTE.

The stiffener 30 may be attached to the semiconductor chip package 18 by an adhesive 32. In one exemplary embodiment, the adhesive may be a polymer sealing agent such as epoxy. An epoxy adhesive has one disadvantage in that a heated cure is needed. In another exemplary embodiment, the adhesive 32 may be an adhesive that may be cured at room temperature by ultraviolet (UV) radiation, thereby avoiding a thermal excursion for stiffener attach. UV curable adhesives are commonly available from suppliers such as MASTERBOND®, LOCTITE® AND 3M™.

The stiffener 30 is temporary and may be reusable once its purpose has been fulfilled. This has the advantage that there are fewer limitations on its thickness and its geometry since it will not be present in the final assembly A particular advantage of using an optically transparent material for the stiffener 30 is that the adhesive 32 may be removed by laser ablation when it is time to remove the stiffener 30. A visible spectrum laser light may be used for localized heating and adhesive removal. The laser light may have a wavelength between 400 nm and 700 nm.

Figure 5:
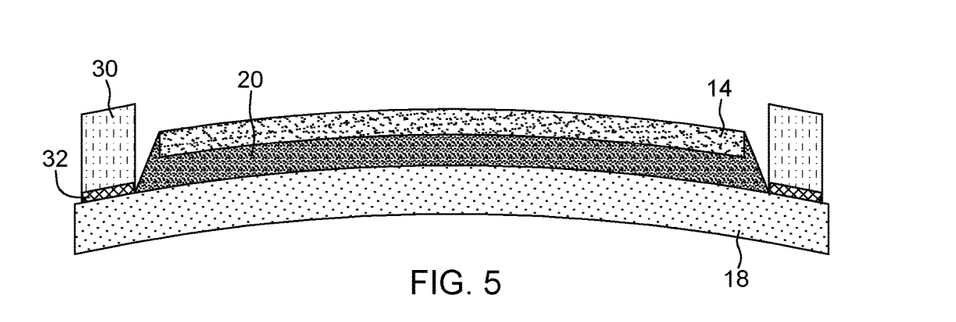
FIG. 5 illustrates the underfill of the semiconductor chip.

Referring now to FIG. 5, an underfill material 20, such as an epoxy, has been dispensed and cured under the semiconductor chip 14.

Figure 6:
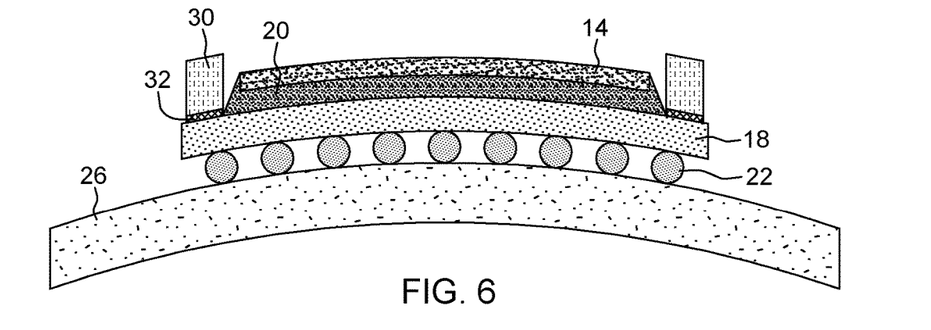
FIG. 6 illustrates the semiconductor chip package attached on a laminate substrate.

Referring now to FIG. 6, semiconductor chip package 18 has been attached to laminate substrate 26 by solder balls 22. The stiffener 30 remains in place on the semiconductor chip package 18 during the process of attaching the semiconductor chip package 18 to the laminate substrate 26.

Figure 7:
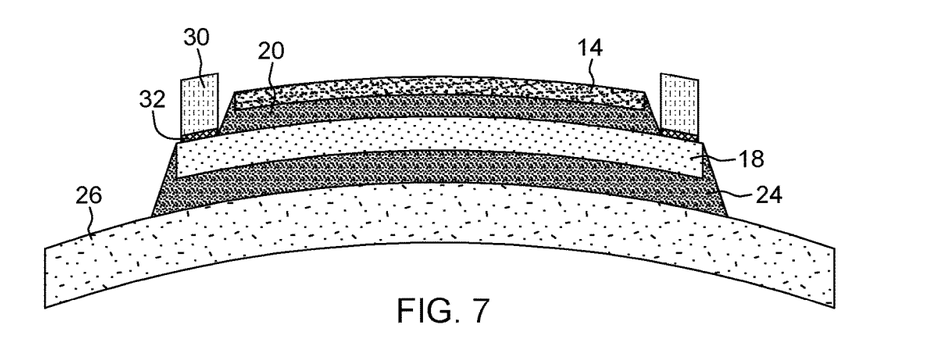
FIG. 7 illustrates the underfill of the semiconductor chip package.

In FIG. 7, an underfill material 24, such as an epoxy, has been dispensed and cured under the semiconductor chip package 18.

Figure 8:
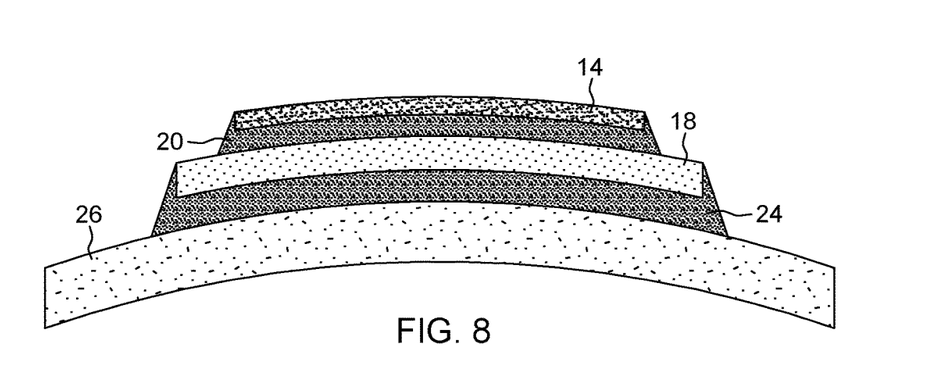
FIG. 8 illustrates the removal of the stiffener.

In FIG. 8, the stiffener 30 has been removed. In the exemplary embodiment where the stiffener 30 is an optically transparent material, a laser may be used to ablate the adhesive 32 and thereby enable the removing of the stiffener 30.

Stiffener materials other than optically transparent materials, such as ceramic and metallic materials, are considered within the scope of the exemplary embodiments but such other stiffener materials are not as preferred as they could not be as easily removed.

Figure 9A:
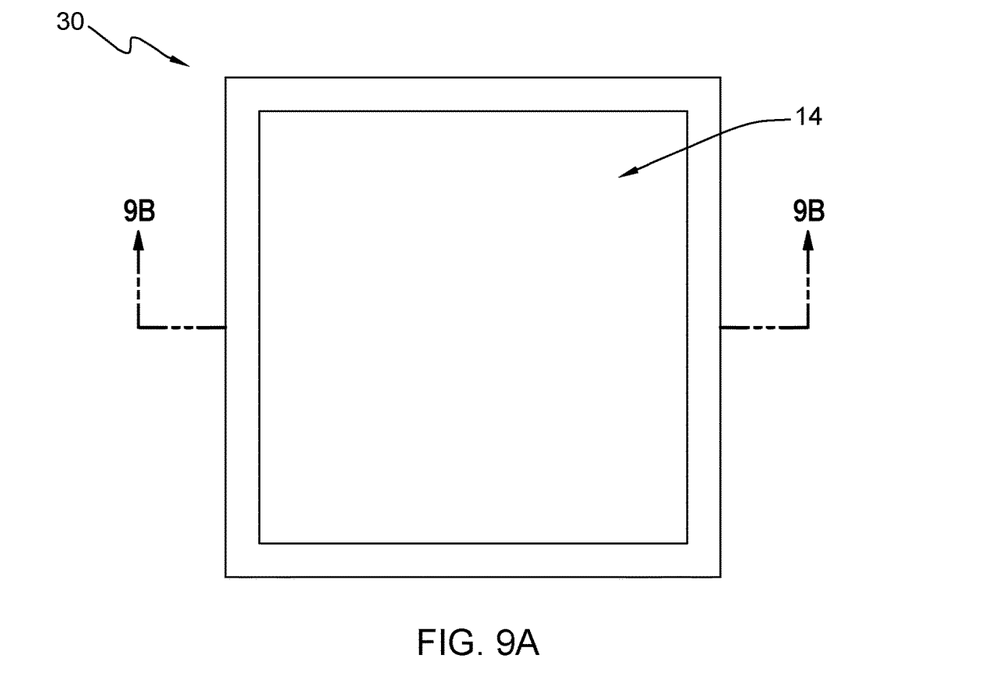
FIG. 9A is a plan view of the stiffener and FIG. 9B is a cross sectional view of the stiffener of FIG. 9A in the direction of arrows 9B-9B.
Figure 9B:
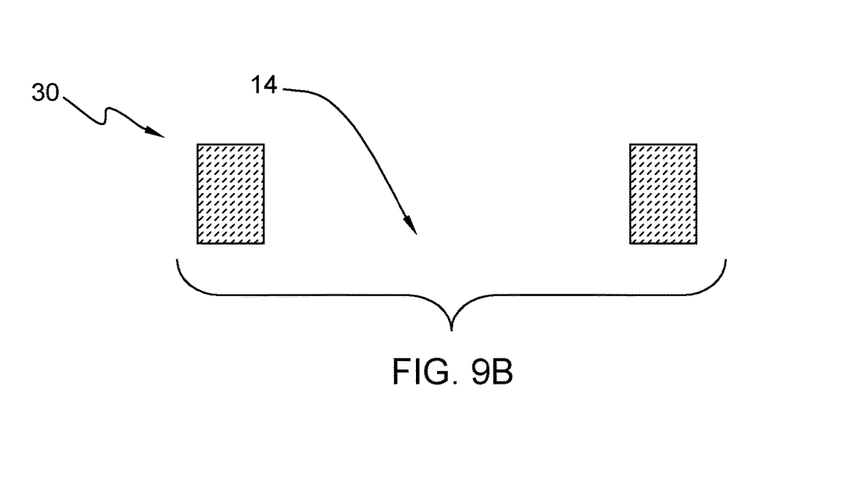

Referring now to FIGS. 9A and 9B, there is illustrated an exemplary embodiment of a stiffener 30 shown in FIGS. 4 to 7. FIG. 9B is a cross sectional view of the stiffener 30 in the direction of arrows 9A-9B. This stiffener 30 is essentially a frame that surrounds the semiconductor chip 14 (indicated by arrow 14 but not actually present in this view) and attaches to the semiconductor chip package 18.

Figure 10A:
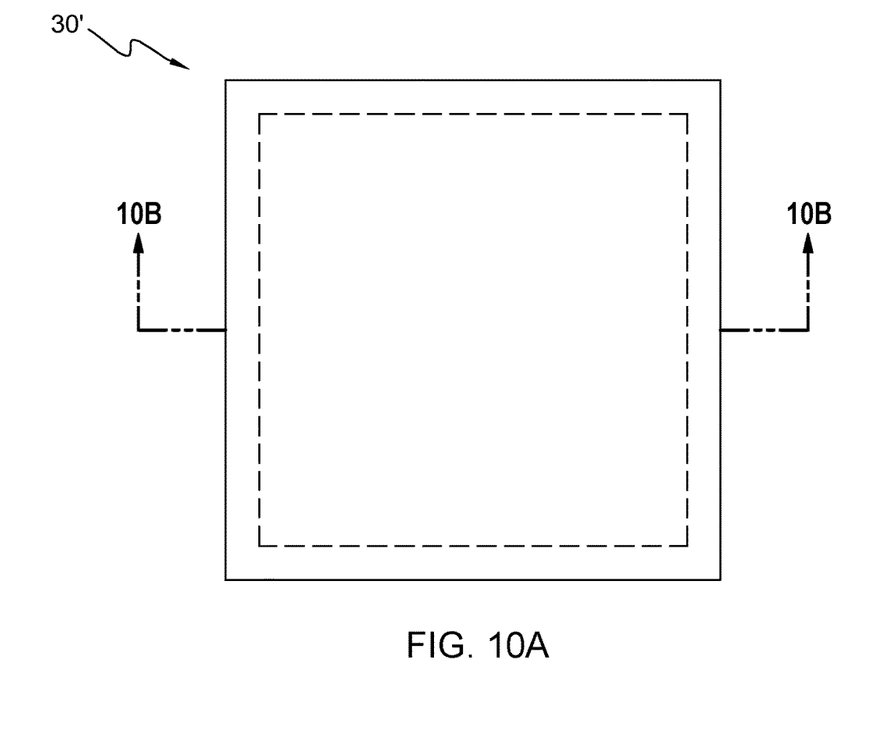
FIG. 10A is a plan view of the stiffener and FIG. 10B is a cross sectional view of the stiffener of FIG. 10A in the direction of arrows 10B-10B.
Figure 10B:
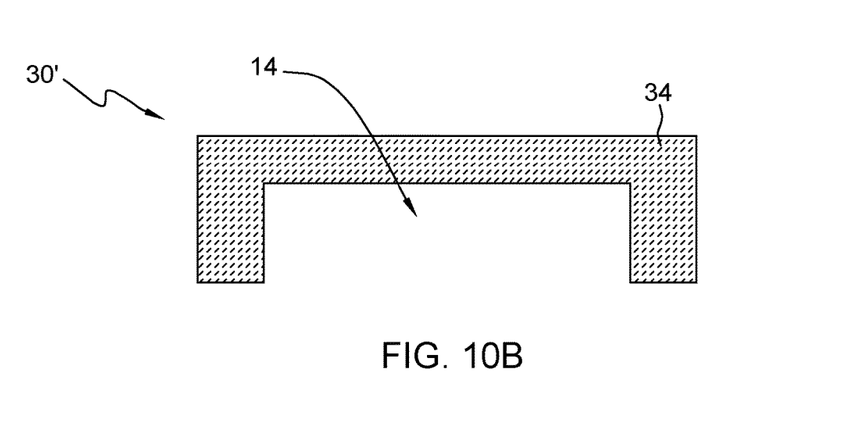

Another exemplary embodiment of a stiffener 30' is illustrated in FIGS. 10A and 10B. FIG. 10B is a cross sectional view of the stiffener 30' in the direction of arrows 10B-10B. This stiffener 30' contains the frame surrounding the semiconductor chip 14 (indicated by arrow 14 but not actually present in this view) similarly to stiffener 30 but also contains a lid 34 for further stiffening.

In one exemplary embodiment illustrated in FIGS. 3 to 8, the stiffener 30 is attached to the semiconductor chip package 18 after the semiconductor chip 14 has been attached to the semiconductor chip package 18. Further, the stiffener 30 is removed after underfill 24 has been applied underneath the semiconductor chip package 18.

For purpose of illustration, a sample assembly may include a 15 and 35 millimeters (mm) square chip, a semiconductor chip package being 20 to 75% larger than the semiconductor chip and a laminate substrate being 20% or more larger than the semiconductor chip package. The semiconductor chip package and the laminate substrate may be made of the same material or may be made of different materials. Among the materials that may be used for the semiconductor chip package and the laminate substrate are, for the purpose of illustration and not limitation, BT-epoxy, FR4, polyimide and central glass reinforced epoxy core with polymer build-up resin layers on either side of the core. The stiffener occupies the space between the edge of the semiconductor chip and the edge of the semiconductor chip package. For a stiffener that is in the form of a frame such as that shown in FIGS. 9A and 9B, the frame width typically varies between 1 mm and 6 mm. For a stiffener that is in the form of a lid such as that shown in FIGS. 10A and 10B the thickness of the lid over the chip may be between 0.5 mm and 3 mm. The overall thickness of the stiffener may be anywhere between 0.5 mm and 4 mm.

However, variations of this assembly sequence are considered within the scope of the exemplary embodiments.

Figure 11:
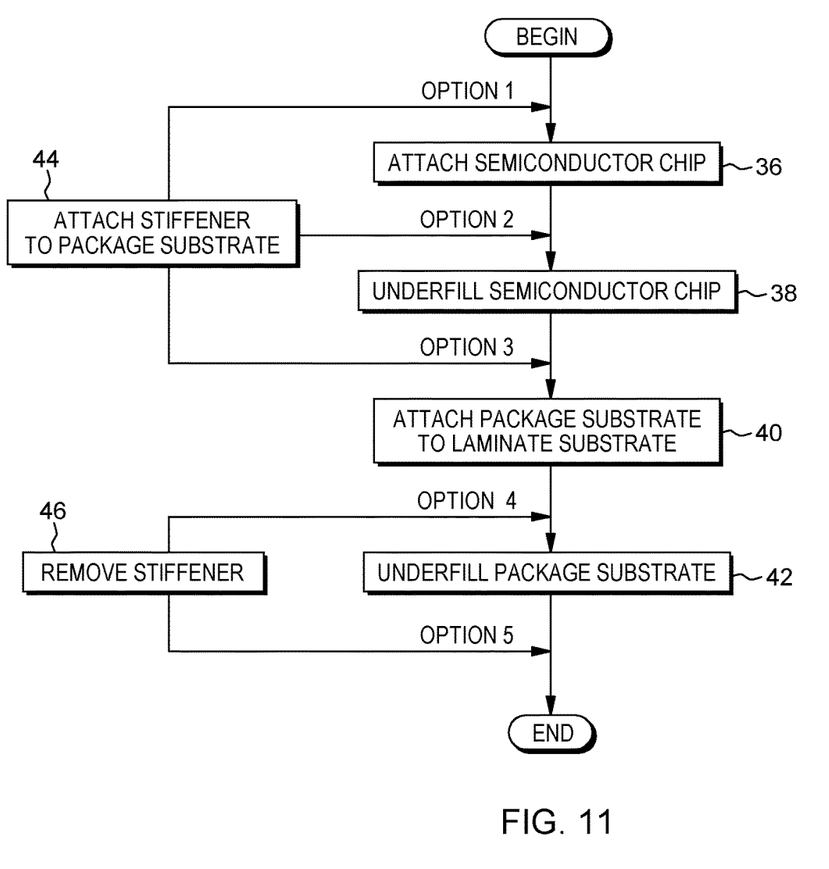
FIG. 11 is a flow chart illustrating various options to vary the assembly sequence in FIGS. 3 to 8.

FIG. 11 is a flow chart illustrating various options that are possible to vary the assembly sequence in FIGS. 3 to 8. Core process steps may include attaching the semiconductor chip to the semiconductor chip package 36, underfill of the semiconductor chip 38, attaching the semiconductor chip package to the laminate substrate 40 and underfill of the semiconductor chip package 42.

There may be three variations of attaching the stiffener to the semiconductor chip package 44. In option 1, the stiffener may be attached to the bare semiconductor chip package before semiconductor chip attach. In option 2, shown in the process sequence in FIGS. 3 to 8, the stiffener may be attached after attaching the semiconductor chip to the semiconductor chip package and before underfill of the semiconductor chip. In option 3, the stiffener may be attached after underfill of the semiconductor chip and before attaching the semiconductor chip package to the laminate substrate.

There may be two variations of removing the stiffener from the semiconductor chip package 46. In option 4, the stiffener may be removed after attaching the semiconductor chip package to the substrate laminate but before underfill of the semiconductor chip package. In option 5, shown in the process sequence in FIGS. 3 to 8, the stiffener may be removed after underfill of the semiconductor chip package.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method to control warpage in a semiconductor chip package comprising:
   attaching a semiconductor chip to a semiconductor chip package, the semiconductor chip package having at least signal distribution and power distribution functions;
   underfilling the semiconductor chip with an underfill material;
   attaching a stiffener to the semiconductor chip package so that the semiconductor chip is contained within the stiffener, the stiffener having a coefficient of thermal expansion (CTE) less than that of the semiconductor chip package;
   attaching the semiconductor chip package to a laminate substrate wherein the laminate substrate comprises a material selected from the group consisting of BT-epoxy, FR4, polyimide and central glass reinforced epoxy core with polymer build-up resin layers on either side of the core;
   underfilling the semiconductor chip package with an underfill material; and
   removing the stiffener after attaching the semiconductor chip package to the laminate substrate.

2. The method of claim 1 wherein the stiffener is selected from the group consisting of glass, sapphire, quartz, diamond, poly(methyl methacrylate) (PMMA), hardened resin and linear low-density polyethylene (LLDPE) plastic material.

3. The method of claim 2 wherein attaching the stiffener to the semiconductor chip package is attaching by an ultraviolet-cured adhesive material.

4. The method of claim 3 wherein removing the stiffener is by laser ablating the ultraviolet-cured adhesive material through the stiffener.

5. The method of claim 1 wherein the stiffener is in the form of a frame that surrounds the semiconductor chip.

6. The method of claim 1 wherein attaching the stiffener is before attaching the semiconductor chip to the semiconductor chip package.

7. The method of claim 1 wherein attaching the stiffener is after attaching the semiconductor chip to the semiconductor chip package and before underfilling the semiconductor chip.

8. The method of claim 1 wherein attaching the stiffener is after underfilling the semiconductor chip and before attaching the semiconductor chip package to the laminate substrate.

9. A method to control warpage in a semiconductor chip package comprising:
   attaching a semiconductor chip to a semiconductor chip package, the semiconductor chip package having at least signal distribution and power distribution functions;
   attaching a stiffener to the semiconductor chip package so that the semiconductor chip is contained within the stiffener, the stiffener having a coefficient of thermal expansion (CTE) less than that of the semiconductor chip package;
   attaching the semiconductor chip package to a laminate substrate wherein the laminate substrate comprises a material selected from the group consisting of BT-epoxy, FR4, polyimide and central glass reinforced epoxy core with polymer build-up resin layers on either side of the core; and
   removing the stiffener after attaching the semiconductor chip package to the laminate substrate.

10. The method of claim 9 wherein the stiffener is selected from the group consisting of glass, sapphire, quartz, diamond, poly(methyl methacrylate) (PMMA), hardened resin and linear low-density polyethylene (LLDPE) plastic material.

11. The method of claim 10 wherein attaching the stiffener to the semiconductor chip package is attaching by an ultraviolet-cured adhesive material.

12. The method of claim 11 wherein removing the stiffener is by laser ablating the ultraviolet-cured adhesive material through the stiffener.

13. The method of claim 9 wherein the stiffener is in the form of a frame that surrounds the semiconductor chip.

14. The method of claim 9 wherein attaching the stiffener is before attaching the semiconductor chip to the semiconductor chip package.

15. The method of claim 1 wherein attaching the stiffener is after attaching the semiconductor chip to the semiconductor chip package and before attaching the semiconductor chip package to the laminate substrate.

16. A method to control warpage in a semiconductor chip package comprising:
   attaching by a solder ball connection a semiconductor chip to a semiconductor chip package, the semiconductor chip package having at least signal distribution and power distribution functions;

underfilling the semiconductor chip with an underfill material;

adhesively attaching an optically transparent stiffener to the semiconductor chip package so that the semiconductor chip is contained within the stiffener, wherein the stiffener is in the form of a frame that surrounds the semiconductor chip, the stiffener having a coefficient of thermal expansion (CTE) less than that of the semiconductor chip package;

attaching by a solder ball connection the semiconductor chip package to a laminate substrate wherein the laminate substrate comprises a material selected from the group consisting of BT-epoxy, FR4, polyimide and central glass reinforced epoxy core with polymer build-up resin layers on either side of the core;

underfilling the semiconductor chip package with an underfill material; and removing the stiffener by a laser ablation process after attaching the semiconductor chip package to the laminate substrate.

17. The method of claim 16 wherein attaching the stiffener to the semiconductor chip package is attaching by an ultraviolet-cured adhesive material.

18. The method of claim 16 wherein removing the stiffener is by laser ablating the ultraviolet-cured adhesive material through the stiffener.

19. The method of claim 16 wherein attaching the stiffener is before attaching the semiconductor chip to the semiconductor chip package.

20. The method of claim 16 wherein attaching the stiffener is after attaching the semiconductor chip to the semiconductor chip package and before attaching the semiconductor chip package to the laminate substrate.

* * * * *